(12) United States Patent
Zenou

(10) Patent No.: US 12,342,470 B2
(45) Date of Patent: Jun. 24, 2025

(54) METHODS TO FILL THROUGH-HOLES OF A SUBSTRATE WITH METAL PASTE

(71) Applicant: Reophotonics, Ltd., Modiin (IL)

(72) Inventor: Michael Zenou, Hashmonaim (IL)

(73) Assignee: Reophotonics, Ltd., Modiin (IL)

( * ) Notice: Subject to any disclaimer, the term of this patent is extended or adjusted under 35 U.S.C. 154(b) by 536 days.

(21) Appl. No.: 17/818,089

(22) Filed: Aug. 8, 2022

(65) Prior Publication Data

US 2024/0049397 A1   Feb. 8, 2024

(51) Int. Cl.
  *H05K 3/46*   (2006.01)
  *H05K 1/11*   (2006.01)
  *H05K 3/00*   (2006.01)

(52) U.S. Cl.
  CPC .......... *H05K 3/0094* (2013.01); *H05K 1/115* (2013.01); *H05K 3/4652* (2013.01); *H05K 2201/09563* (2013.01); *H05K 2203/107* (2013.01)

(58) Field of Classification Search
  CPC ................. H05K 3/0094; H05K 1/115; H05K 2201/09563; H05K 2203/107; H05K 2203/0139; H05K 2203/0191; H05K 2203/0557; H05K 3/4069; H05K 3/0079; Y10T 29/4912; Y10T 29/49155; Y10T 29/49165
  See application file for complete search history.

(56) References Cited

U.S. PATENT DOCUMENTS

| | | |
|---|---|---|
| 4,728,568 A | 3/1988 | Sasada et al. |
| 5,888,627 A | 3/1999 | Nakatani |
| 6,197,407 B1 * | 3/2001 | Andou ............... H05K 3/20 428/209 |
| 6,546,624 B2 * | 4/2003 | Echigo ............ H05K 3/4069 216/13 |
| 6,739,040 B1 | 5/2004 | Nakamura et al. |

(Continued)

FOREIGN PATENT DOCUMENTS

| | | | |
|---|---|---|---|
| JP | 2005116696 A | 4/2005 | |
| JP | 3794099 B2 | 7/2006 | |

OTHER PUBLICATIONS

International Search Report and Written Opinion mailed Oct. 16, 2023, from the ISA/European Patent Office, for International Patent Application No. PCT/IB2023/056526 (filed Jun. 23, 2023), 15 pgs.

(Continued)

*Primary Examiner* — Donghai D Nguyen
(74) *Attorney, Agent, or Firm* — Ascenda Law Group, PC

(57) ABSTRACT

In a method for filling through-holes of a substrate with a metal paste, an upper lamination foil is secured to the top surface of the substrate and a lower lamination foil is secured to the bottom surface of the substrate. A laser beam is used to generate a first plurality of holes in the upper lamination foil, and a second plurality of holes in the lower lamination foil. Respective locations of the first and second plurality of holes are aligned with the through-holes of the substrate. Metal paste is applied into the through-holes through the first plurality of holes using a squeegee or a knife. Any metal paste that is pressed out from the second plurality of holes may be scraped off by the squeegee or the knife and recycled. Finally, the upper and lower lamination foils may be removed from the substrate.

13 Claims, 22 Drawing Sheets

(56) References Cited

U.S. PATENT DOCUMENTS

| | | |
|---|---|---|
| 6,831,236 B2 | 12/2004 | Higuchi et al. |
| 6,889,433 B1 | 5/2005 | Enomoto et al. |
| 6,890,449 B2 * | 5/2005 | Kawamoto .......... H05K 3/4069 |
| | | 29/830 |
| 8,124,325 B2 | 2/2012 | Speakman |
| 8,446,736 B2 | 5/2013 | Kita et al. |
| 2008/0127484 A1 | 6/2008 | Tourne |
| 2008/0308304 A1 | 12/2008 | Nakamura et al. |
| 2010/0236698 A1 | 9/2010 | Sekimoto |

OTHER PUBLICATIONS

International Preliminary Report on Patentability dated Nov. 25, 2024, from the IPEA/European Patent Office, for International Patent Application No. PCT/IB2023/056526 (filed Jun. 23, 2023), 38 pgs.

"Laser drilling", Wikipedia, May 31, 2022, XP093171451, retrieved from the Internet: URL:https://en.wikipedia.org/w/index.php?title=Laser_drilling&oldid=1090852952, 7 pgs.

* cited by examiner

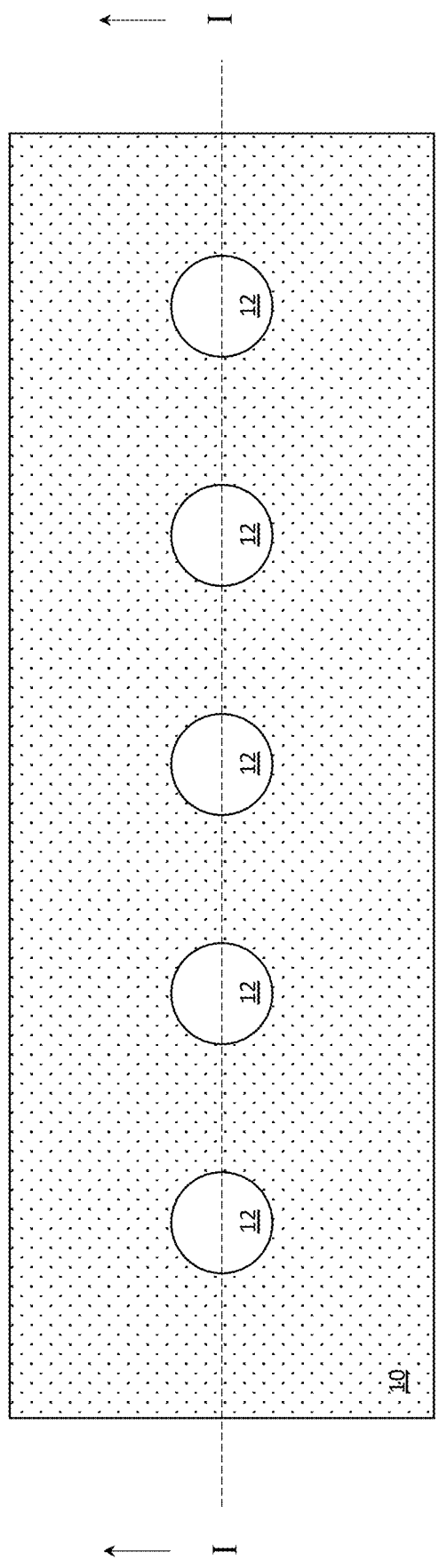

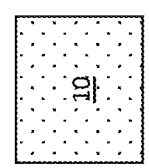
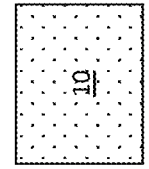
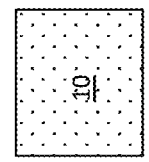
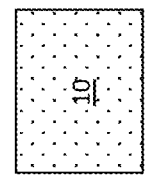
Fig. 2A

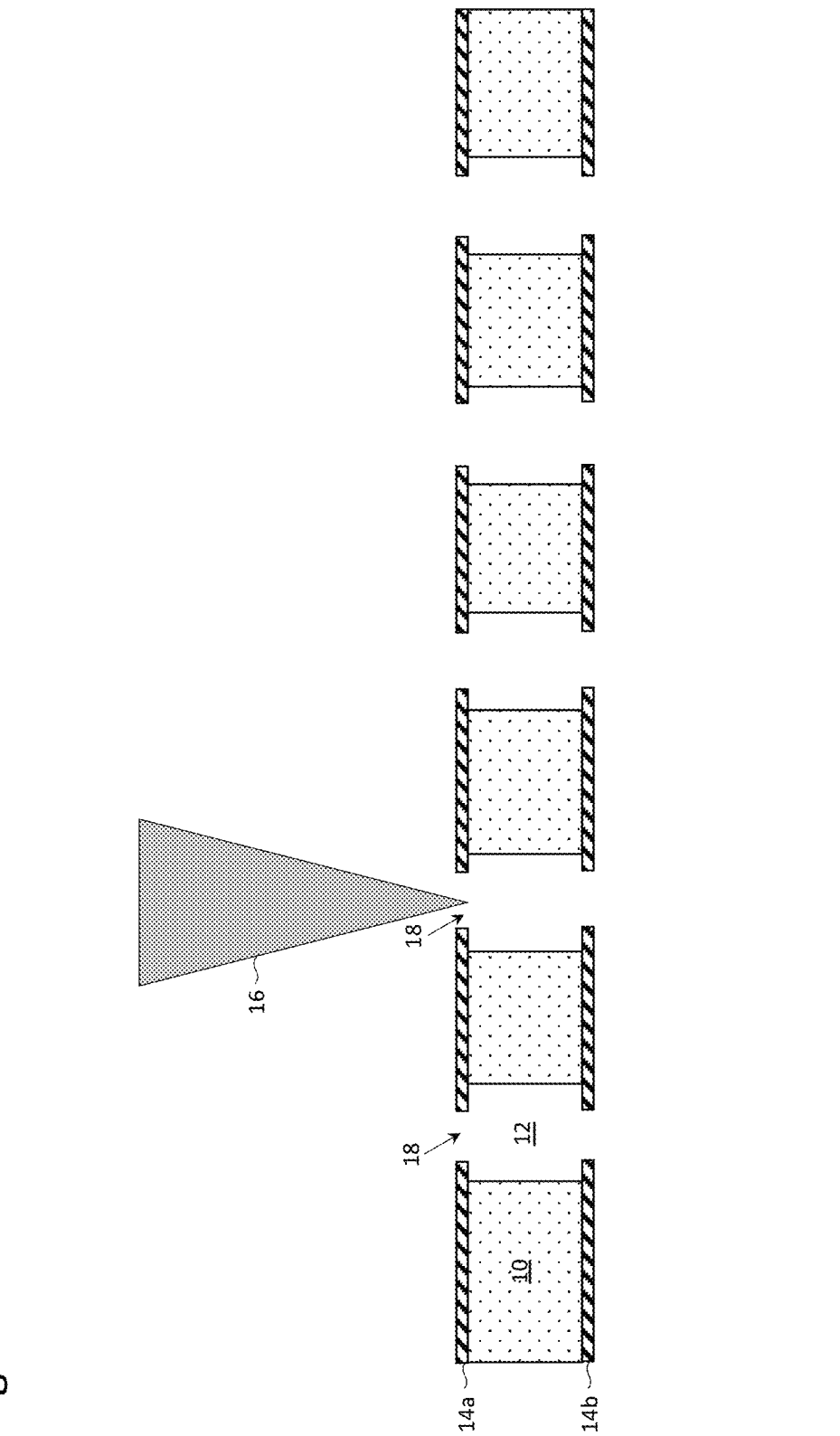

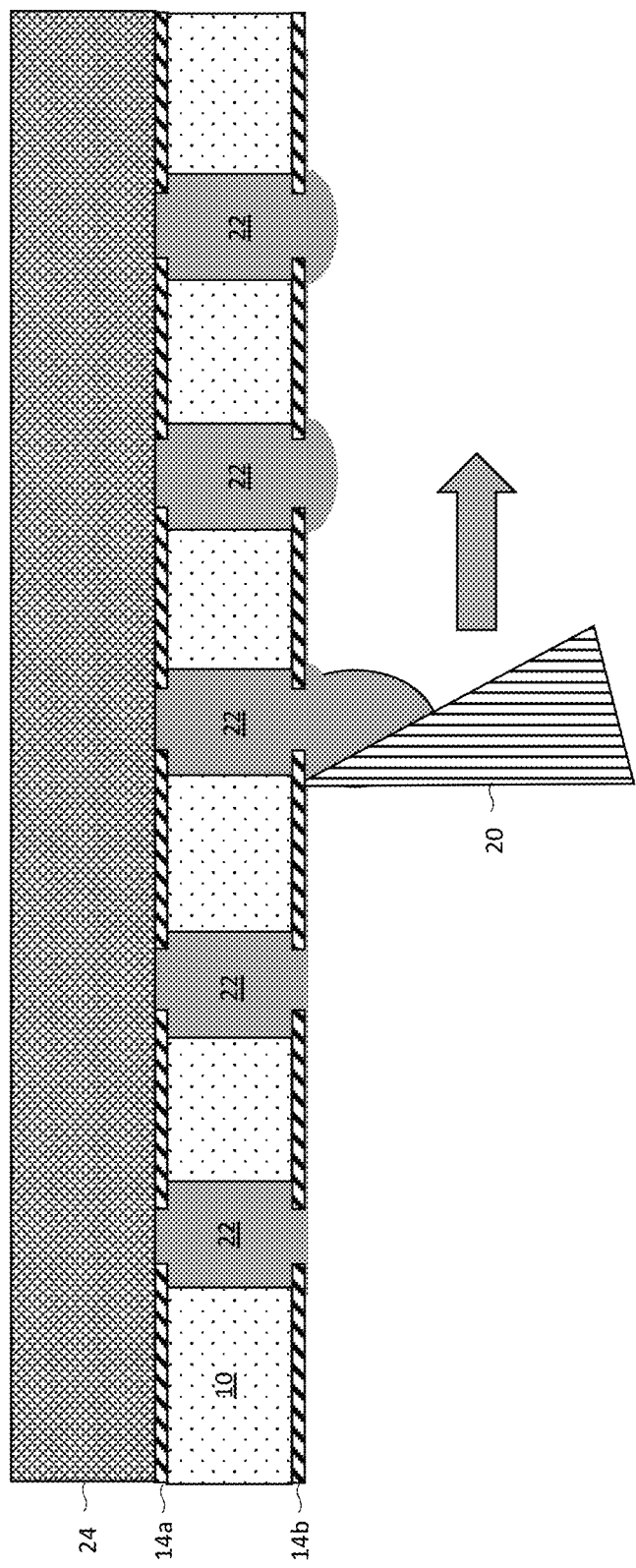

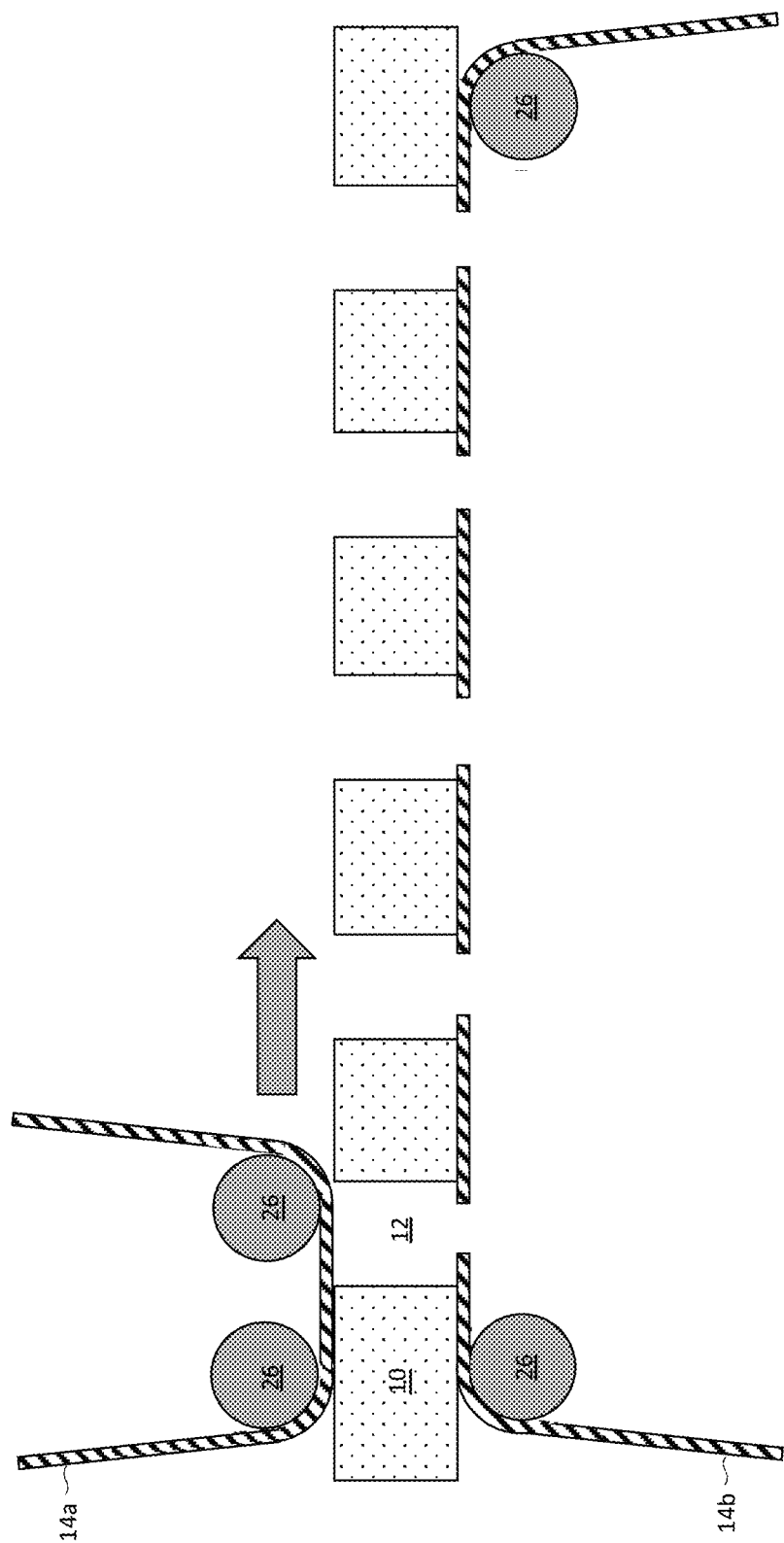

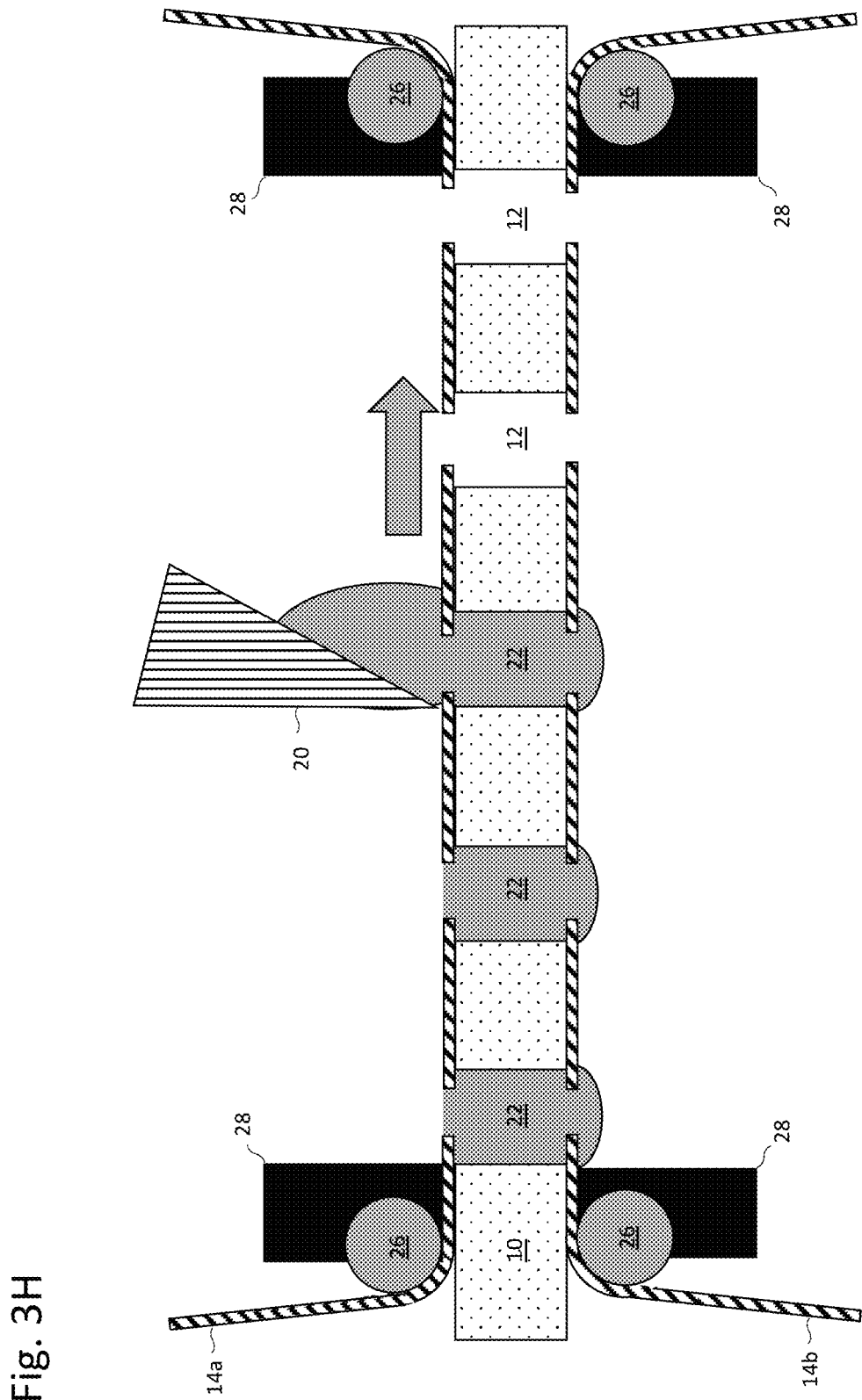

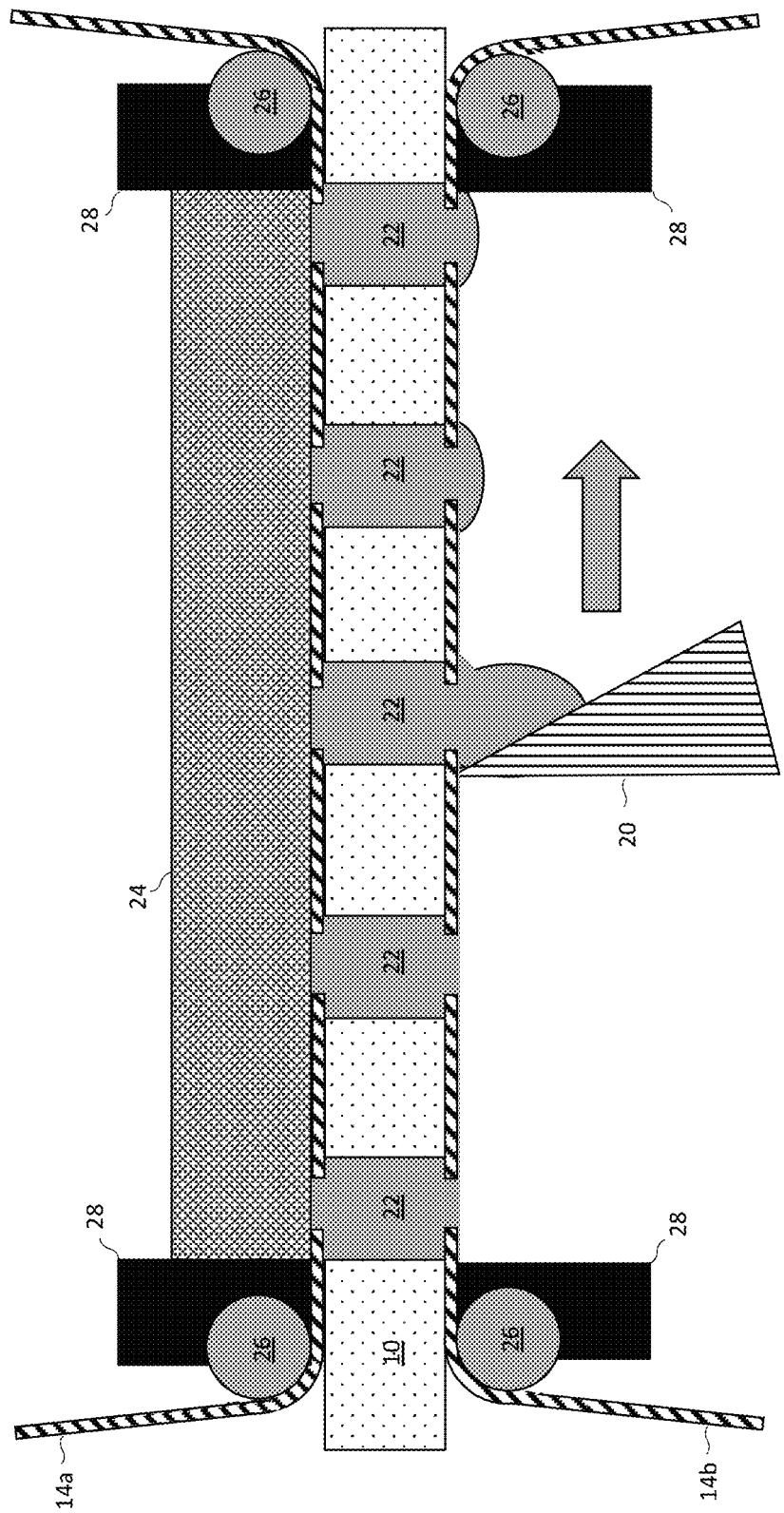

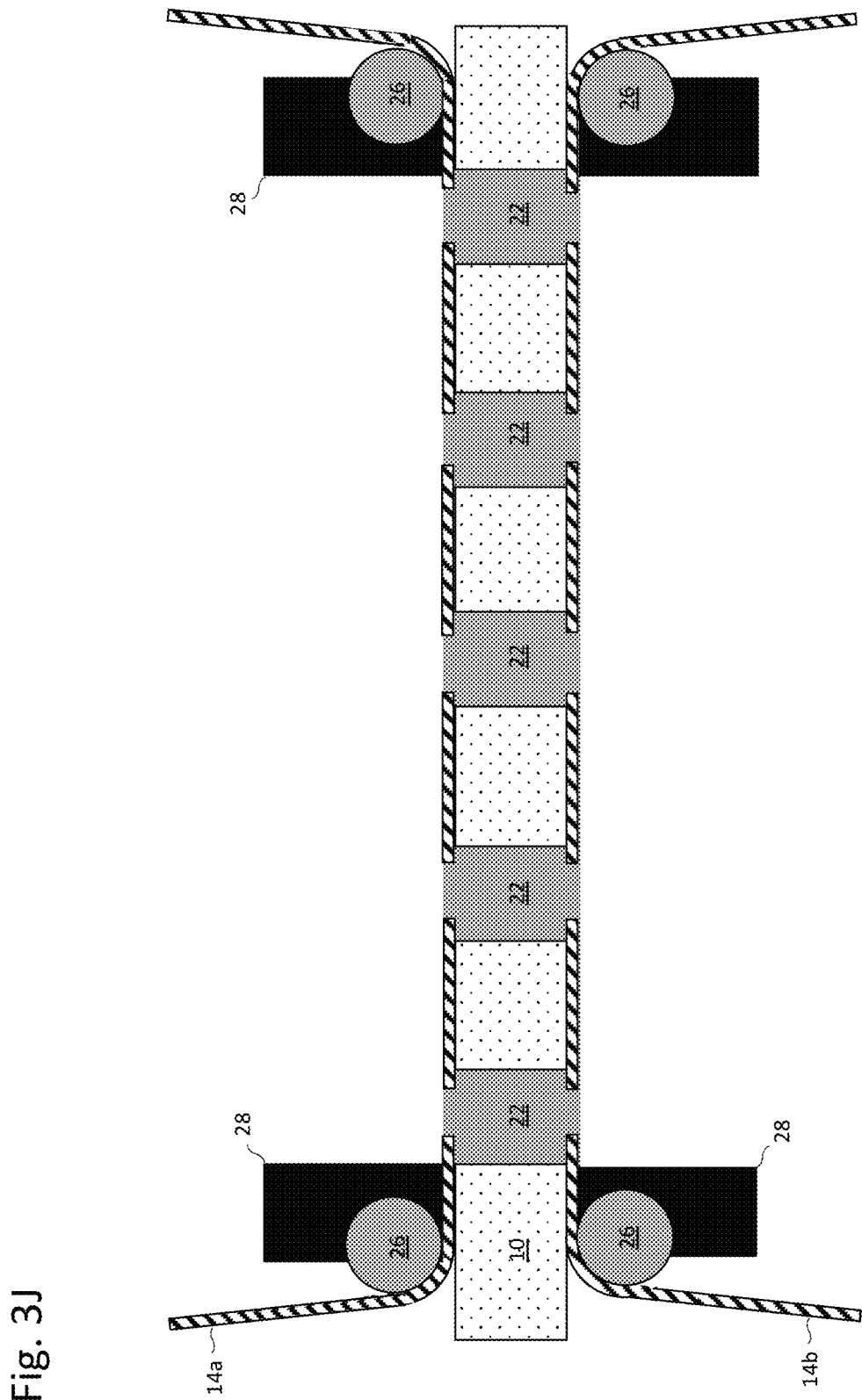

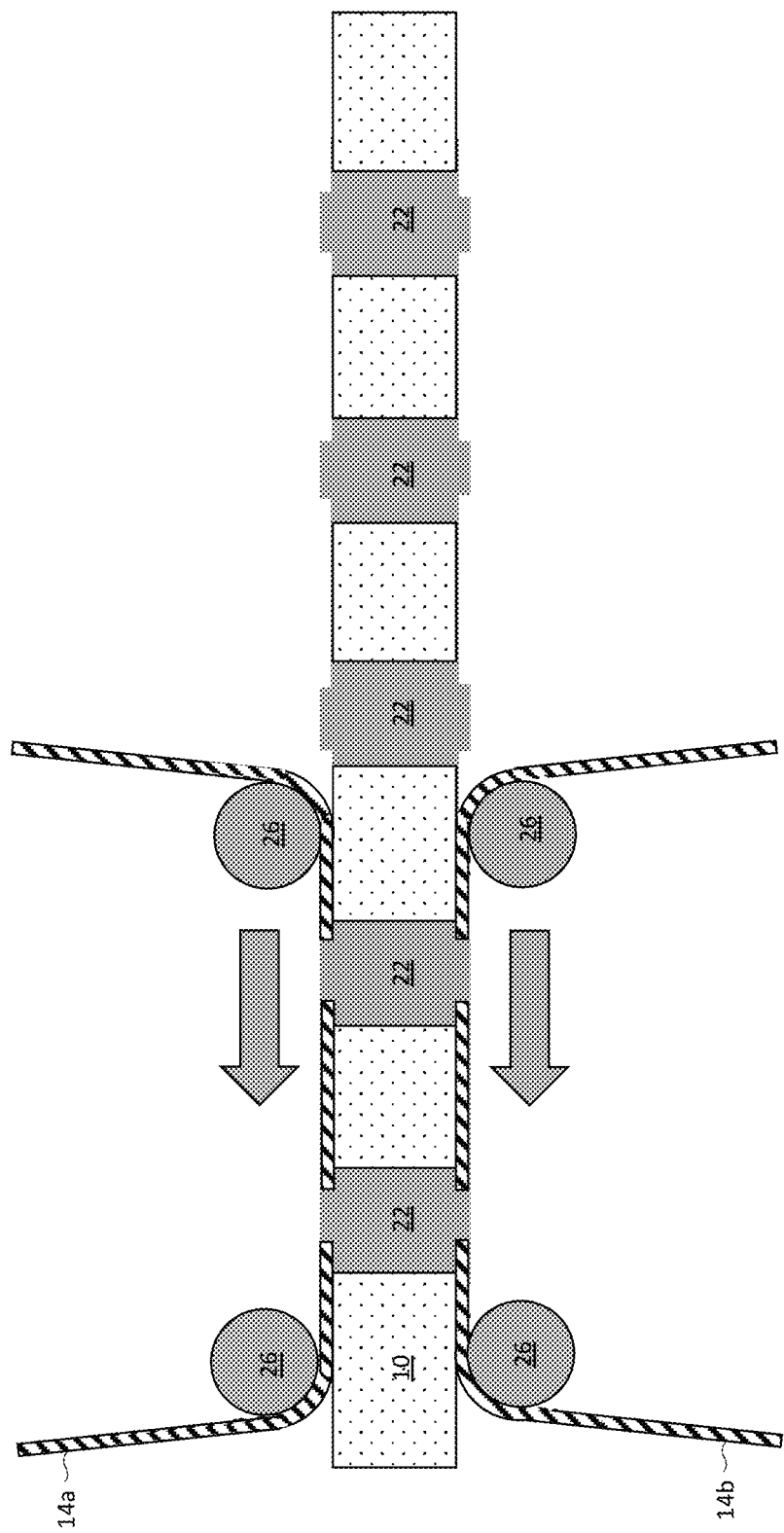

METHODS TO FILL THROUGH-HOLES OF A SUBSTRATE WITH METAL PASTE

FIELD OF THE INVENTION

The present invention relates to methods for filling through-holes of a substrate with metal paste, and more specifically relates to methods for using lamination foils to define the top and bottom boundaries of the through-holes during the filling process.

BACKGROUND

Surface Mount Technology (SMT) is a field of electronic assembly in which electronic components are mounted on the surface of a printed circuit board (PCB) as opposed to the leads of components being inserted through holes in the PCB as in the conventional assembly. SMT was developed to reduce manufacturing costs and allow efficient use of PCB area. As a result of the introduction of SMT and ever-increasing levels of automation, it is now possible to build highly complex electronic circuits into smaller and smaller assemblies with good reproducibility.

Further, the recent trend toward miniaturization has created a need for the fabrication of highly integrated PCBs. Such PCBs are generally fabricated by lithography using extractive methods, for example etching. In such a fabrication method, conductive lines are formed by placing a conductive foil on a substrate and etching away unwanted portions of the conductive foil (e.g., with a corrosive solution) so as to leave behind only the conductive lines. In addition to improved integration, multilayer PCBs and double-sided PCBs are important features for increased miniaturization. Current fabrication of multilayer PCBs involves complicated processes, including drilling to form through holes in order to enable conduction between multilayer boards, laminating the boards, and soldering electronic components to the PCBs. When soldering is performed to attach the electronic components to the PCBs, melted solder tends to spread out, requiring the electronic components to be located in an area larger than the footprint of the electronic components, which limits miniaturization. Therefore, there is a need for devices and methods enabling efficient and precise fabrication of complex circuit boards.

Connecting multiple layers of a PCB makes it possible to reduce the size of the PCB, as the layers can be stacked. However, one of the most challenging parts in the manufacturing of high-density interconnect (HDI) boards is the formation of a conductive net at high resolution that distributes the signals inside the PCBs. To create such a net, vias may be used to make an electrical connection between the layers of a multilayer PCB. A via may be constructed by placing copper pads on each layer of the PCB and drilling a hole through them. The hole may be made conductive through electroplating or by inserting copper within the hole.

There are several types of vias, including through-hole vias, blind vias, and buried vias. Through-hole vias go straight through the PCB from the top surface of the PCB to bottom surface of the PCB and can be used to connect all the layers of a PCB. Such vias are the most common and easiest to construct. Blind vias connect the outermost layer of a PCB to the layer immediately adjacent to the outermost layer. Such vias cannot be seen on the other side of the PCB and therefore are called blind vias. Buried vias can be used to connect internal layers of a PCB, and are not visible on the surface of the PCB.

The process to produce any type of via is complicated and involves many steps, a fact that significantly increases the cost and time to manufacture a multilayer PCB.

SUMMARY OF THE INVENTION

The present inventors have recognized that it is desirable to provide a "one stop shop" to produce a layer of a PCB with high precision and at a high production rate. PCB production is a highly developed field with a significant number of stages. An object of the invention is to improve upon one of the most important steps in the production process—the formation of a via—to improve the overall production of the PCB board. Accordingly, the present invention relates to methods for printing one layer of PCB (rigid or flexible) as part of the production of a multilayer PCB.

Various embodiments of the invention utilize a laser system and a flowable material to produce a substrate filled with metal paste at selected areas. The final structure has two basic properties: it has structural and/or mechanical properties that are dictated by the substrate, and it contains conductive paths through the substrate that are formed by the vias.

In some embodiments of the present invention, the substrate that is used for the formation of the layer can be made from a flexible or a rigid material.

In some embodiments of the present invention, the substrate that is used for the formation of the layer can have a thickness between 1 µm and 1 mm.

In some embodiments of the present invention, the top and bottom surfaces of substrate may be smooth or rough, and preferably are smooth to allow subsequent layers of the PCB assembly to better adhere to the substrate.

In some embodiments of the present invention, through-holes in the substrate can be created by a laser, a mechanical drill or other tools. A laser is typically to used create through-holes in flexible and thinner substrates, whereas a mechanical drill is typically used to create through-holes in rigid and thicker substrates.

In some embodiments of the present invention, anti-stick foils (also called lamination foils) are laminated on both sides (i.e., top and bottom) of the substrate. The lamination foils can be secured to the substrate with or without an adhesive. In the former case, an adhesive can first be applied to the side of the lamination foil facing the substrate prior to securing the lamination foil onto the substrate to create a stronger attachment between the foil and the substrate. If necessary, the adhesive can be removed at the end of the filling process. One benefit of using an adhesive is the reduction in the formation of voids between the substrate and each of the lamination foils, which in turn reduces the possibility of metal paste being introduced into such voids and the formation of defects caused by such interposed metal paste.

In some embodiments of the present invention, each of the lamination foils may be flexible, with a thickness of less than 1 µm in some embodiments or less than 100 µm in other embodiments.

In some embodiments of the present invention, the lamination foil can be made from any laser absorbing plastic such as polyethylene terephthalate (PET), polyethylene naphthalate (PEN), polyethylene (PE), polypropylene (PP), polyphenylene sulfide (PPS), etc. Another possible material for the lamination foil is Kapton® from DuPont de Nemours®, Inc. of Wilmington, DE. Regardless of the particular material used, an important property of the foil is its ability to be cut without leaving uncontrolled cut edges. The characteristics of a cut edge depend on the particular type of laser that is used for cutting the foil and the foil properties.

In some embodiments of the present invention, an IR laser, visible light laser or a UV laser may be used to form the holes in the foils (i.e., during the ablation process). A higher energy laser (i.e., in the ultraviolet (UV) wavelength) with higher pulse frequencies (i.e., a nanosecond laser or picosecond laser) will cut the foil better, since it will not cause any thermal deformation in the foils. If a lower energy laser with lower pulse frequencies is employed, the thermal deformation may create an edge at the end of the cut and that edge height may be in the range of 1 μm for some materials (e.g., Kapton® or PPS) and above 10 μm for other materials (e.g., PET and PP).

In some embodiments of the present invention, it is essential that, from both ends of the subsequently formed via, the edges of the via are "well defined" by choosing the correct foil material and a suitable laser. The meaning of "well defined" for the via edge depends on the particular application. For applications with thicker substrates, the via edge can be less accurate and PP or PET foils can be ablated with an IR laser, whereas for other applications where very thin substrates are used, the via edge should be more accurate and Kapton® foils can be ablated with a picosecond UV laser.

In some embodiments of the present invention, debris created by the ablation of the foil may be removed by a suction to prevent contamination.

In some embodiments of the present invention, the respective diameters of the holes in the lamination foils may be smaller than the respective diameters of the through-holes in the substrate to ensure that the metal paste is only deposited within the through-holes and not onto the top and bottom surfaces of the substrate.

In some embodiments of the present invention, a metal paste is pressed into the through-holes through the holes in the lamination foil using a squeegee formed by a rigid or flexible material.

In some embodiments of the present invention, the metal paste is distributed over the upper lamination foil and a squeegee is used to push the material inside of the through-holes through the holes in the upper lamination foil.

In some embodiments of the present invention, the force that is applied to the metal paste may be strong enough to not only fill the through-holes with the metal paste, but also to push some of the metal paste out of the holes in the lower lamination foil. However, since the metal paste is a viscous material, the metal paste will not drip from the holes in the lower lamination foil, but rather will adhere to the area immediately adjacent to the holes in the lower lamination foil.

In some embodiments of the present invention, the metal paste can be a copper paste, a silver paste, a gold paste, or a paste of any other material.

In some embodiments of the present invention, the squeegee or knife may be used to remove and collect the metal paste that protrudes out of the holes in the lower laminate foil. During such step of removing the excess metal paste, a flexible backing member may be secured to the upper lamination foil in order to prevent the metal paste from being pushed out of the holes in the upper lamination foil.

In some embodiments of the present invention, the lamination foils are secured to the substrate surface by rollers or knives that press the lamination foils towards one another.

In some embodiments of the present invention, both of the foils may be linearly translated with rollers after the filling process, such that fresh segments of foil are used when carrying out the filling process for every new substrate.

In some embodiments of the present invention, subsequent to removing the lamination foils from the substrate, the metal paste that has adhered to the lamination foils may be recycled.

In some embodiments of the present invention, a substrate with vias produced according to the present method may be used as part of the formation of a single-sided or a double-sided PCB, significantly increasing the PCB production speed.

BRIEF DESCRIPTION OF THE DRAWINGS

The present invention is illustrated by way of example, and not limitation, in the figures of the accompanying drawings, in which:

FIG. 1 depicts a top view of a substrate with a plurality of through-holes, in accordance with one embodiment of the invention.

FIG. 2A depicts a cross-sectional view of the substrate along line I-I depicted in FIG. 1, in accordance with one embodiment of the invention.

FIG. 2D depicts a laser beam being used to generate holes in the upper lamination foil, in accordance with one embodiment of the invention.

FIG. 2G depicts a squeegee or a knife being used to remove excess metal paste from the lower lamination foil while a backing member blocks the holes in the upper lamination foil, in accordance with one embodiment of the invention.

FIGS. 3E-3G depict rollers being using to secure a lamination foil onto the top surface of the substrate, in accordance with one embodiment of the invention.

FIG. 3G further depicts a laser beam being used to generate holes in the upper lamination foil, in accordance with one embodiment of the invention.

FIG. 3H depicts a squeegee or a knife being used to press metal paste into the through-holes of the substrate through the holes in the upper lamination foil, in accordance with one embodiment of the invention.

FIG. 3I depicts a squeegee or a knife being used to remove excess metal paste from the lower lamination foil while a backing member blocks the holes in the upper lamination foil, in accordance with one embodiment of the invention.

FIG. 3J depicts the structure after the excess metal paste has been removed by the squeegee or knife and the flexible backing member has been removed, in accordance with one embodiment of the invention.

FIG. 3K depicts the removal of the upper and lower lamination foils from the substrate, in accordance with one embodiment of the invention.

DETAILED DESCRIPTION

In the following detailed description of the preferred embodiments, reference is made to the accompanying drawings that form a part hereof, and in which are shown by way of illustration specific embodiments in which the invention may be practiced. It is understood that other embodiments may be utilized and structural changes may be made without departing from the scope of the present invention. Descriptions associated with any one of the figures may be applied to different figures containing like or similar components/steps.

FIG. 1 depicts a top view of a substrate 10 with through-holes 12. The substrate 10 may be a flexible substrate or a rigid substrate with a thickness between 1 μm and 1 mm. The top and bottom surfaces of the substrate 10 may be smooth or rough, and preferably are smooth to allow subsequent layers of the PCB assembly (that are formed at later stages) to better adhere to the substrate 10. The through-holes 12 in the substrate 10 can be created by a laser, by a mechanical drill or by other tools. A laser is typically to used create the through-holes 12 in flexible and thinner substrates 10, whereas a mechanical drill is typically used to create the through-holes 12 in rigid and thicker substrates 10. Each of the through-holes 12 may have a circular cross section. Five through-holes 12 are depicted in FIG. 1 for ease of illustration, but it is understood that such number is an example only and other numbers of through-holes 12 are possible.

FIG. 2A depicts a cross-sectional view of the substrate 10 along line I-I depicted in FIG. 1. As shown in FIG. 2A, the through-holes 12 may penetrate from the top side of the substrate 10 through to the bottom side of the substrate 10.

Figure 2B:
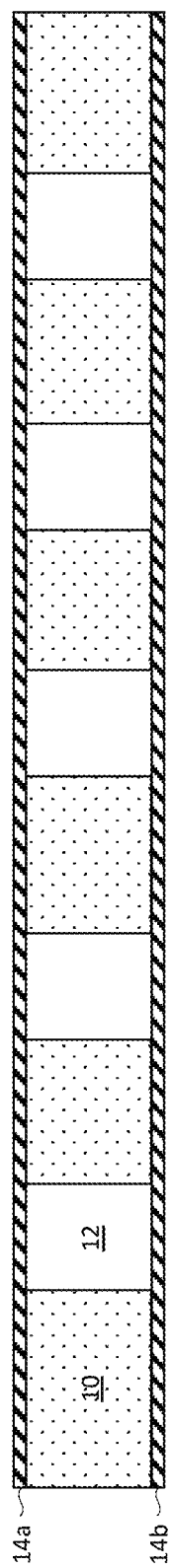
FIG. 2B depicts lamination foils that have been secured to the top and bottom surfaces of the substrate, in accordance with one embodiment of the invention.

As shown in FIG. 2B, anti-stick foils 14a, 14b (also called lamination foils) may be secured to the top and bottom surfaces of the substrate 10 with or without an adhesive (not shown). In the former case, an adhesive can first be applied to the side of the lamination foil 14a, 14b facing the substrate 10 prior to securing the lamination foil 14a, 14b onto the substrate 10 to create a stronger attachment between the foil 14a, 14b and the substrate 10. If necessary, the adhesive can be removed at the end of the filling process. One benefit of using an adhesive is the reduction in the formation of voids between the substrate 10 and each of the lamination foils 14a, 14b, which in turn reduces the possibility of metal paste being introduced into such voids and the formation of defects caused by such interposed metal paste.

Each of the lamination foils 14a, 14b may be flexible, with a thickness of less than 1 μm in some embodiments or less than 100 μm in other embodiments. The lamination foil can be made from any laser absorbing plastic such as polyethylene terephthalate (PET), polyethylene naphthalate (PEN), polyethylene (PE), polypropylene (PP), polyphenylene sulfide (PPS), etc. Another possible material for the lamination foil is Kapton®. Regardless of the particular material used, an important property of the foil is its ability to be cut without leaving uncontrolled cut edges. The characteristics of a cut edge depend on the particular type of laser that is used for cutting the foil and the foil properties.

Figure 2C:
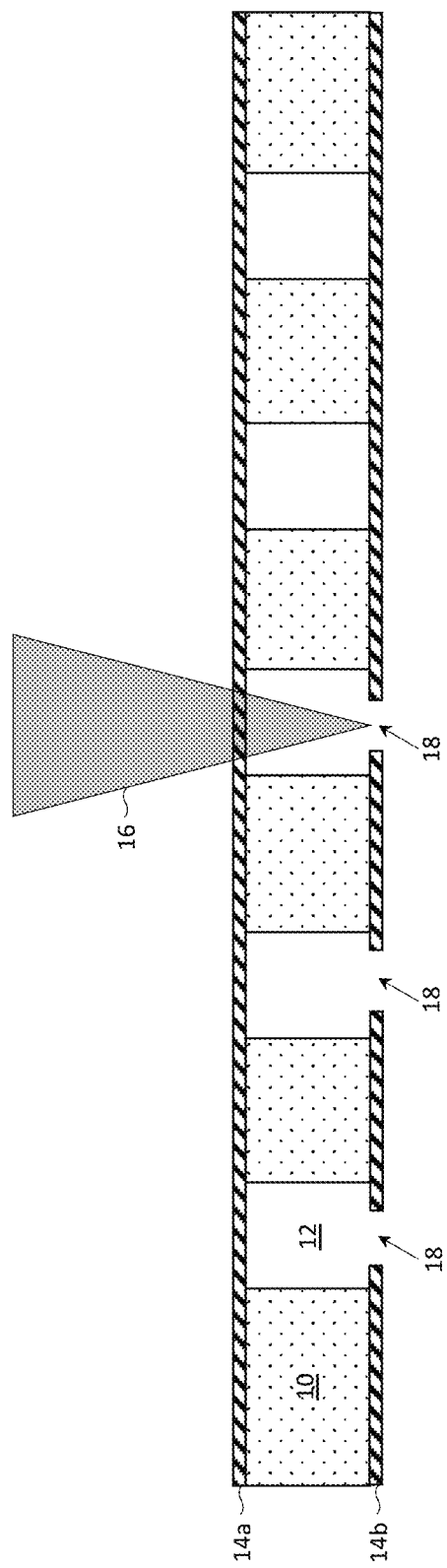
FIG. 2C depicts a laser beam being used to generate holes in the lower lamination foil, in accordance with one embodiment of the invention.

As shown in FIG. 2C, a laser beam 16 may be used to form holes 18 in the lower foil 14b corresponding to the respective locations of the through-holes 12. In one embodiment, the upper foil 14a may be partially transparent to the laser beam 16, allowing the laser beam 16 to pass through the upper foil 14a and form holes 18 in the lower foil 14b. In another embodiment, the laser beam 16 may be focused on the lower foil 14b, allowing the laser beam 16 to pass through the upper foil 14a without forming a hole in the upper foil 14a. As shown in FIG. 2D, the laser beam 16 may similarly be used to form holes 18 in the upper foil 14a corresponding to the respective locations of the through-holes 12 after the holes 18 are formed in the lower foil 14b. To prevent contamination, debris created by the ablation of the foil may be removed by a suction (not depicted).

Almost any laser that is strong enough can be used for the ablation process, but generally an infrared (IR) laser, a visible light laser or an ultraviolet (UV) laser will be used for the ablation. A higher energy laser (i.e., UV) with higher pulse frequencies (i.e., a nanosecond laser or picosecond laser) will cut the foil better, since it will not cause any thermal deformation in the foil. If a lower energy laser with lower pulse frequencies is employed, the thermal deformation creates an edge at the end of the cut and that edge height may be in the range of 1 μm for some materials (e.g., Kapton® or PPS) and above 10 μm for other materials (e.g., PET and PP).

FIGS. 2C and 2D illustrate the cutting of the two foils 14a, 14b and it is essential that, from both ends of the subsequently formed via, the edges of the via are "well defined" by choosing the correct foil material and the suitable laser. The meaning of "well defined" for the via edge depends on the particular application. For applications with thicker substrates, the via edge can be less accurate and PP or PET foils can be ablated with an IR laser, whereas for other applications where very thin substrates are used, the via edge should be more accurate and Kapton® foils can be ablated with a picosecond UV laser.

Proper alignment between the through-hole 12 and the holes 18 is important to ensure that metal paste can be deposited into the through-hole 12 through the holes 18. In one embodiment, the same ablation system is used to form the through-holes 12 and the holes 18, such that the ablation system can form the form the through-holes 12 in a first pass based on CAD schematics, and then perform a second pass to form the holes 18 at the exact same locations where it formed the through-holes 12 based on the same CAD schematics. In another embodiment, after the through-holes 12 have been formed in the substrate 10, the substrate 10 may be imaged to identify the locations of the through-holes 12, and the system may form the holes 18 in the foils 14a, 14b based on the imaged locations of the through-holes 12.

The respective diameters of the holes 18 may be smaller than the respective diameters of the through-holes 12 to ensure that the metal paste is only deposited within the through-holes 12 and not onto the top and bottom surfaces of the substrate 10. In one embodiment, each of the diameters of the holes 18 is between 50 μm and 500 μm. The laser spot size and time that the laser beam is incident on the surface of the foil may be adjusted in order to generate holes 18 with a desired diameter.

Figure 2E:
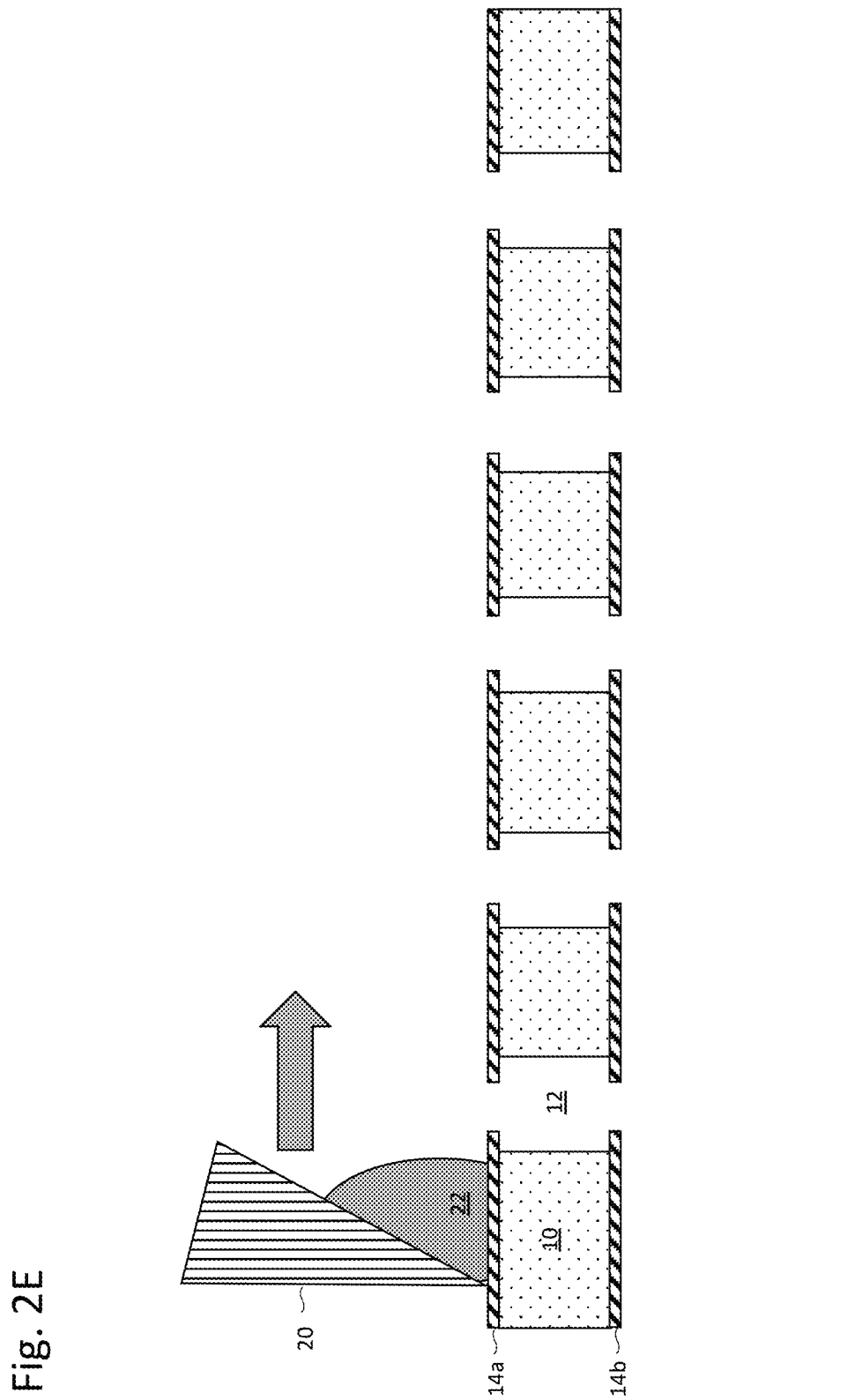
FIG. 2E depicts metal paste being applied to the upper lamination foil, in accordance with one embodiment of the invention.

As shown in FIG. 2E, metal paste 22 is first distributed on the upper lamination foil 14a. Using a squeegee or a knife 20, the metal paste 22 is pushed into the through-holes 12 through the holes 18 in the upper lamination foil 14a. The squeegee 20 may be made from a rigid or flexible material and may be translated in a direction parallel to an extent of the substrate 10. Holes 18 in the lower lamination foil 14b may allow any air that is present within the through-holes 12 to flow out of the through-holes 12 when the metal paste 22 is pushed into the through-holes 12, avoiding the formation of air pockets in the metal paste 22 that is deposited within the through-holes 12.

Figure 2F:
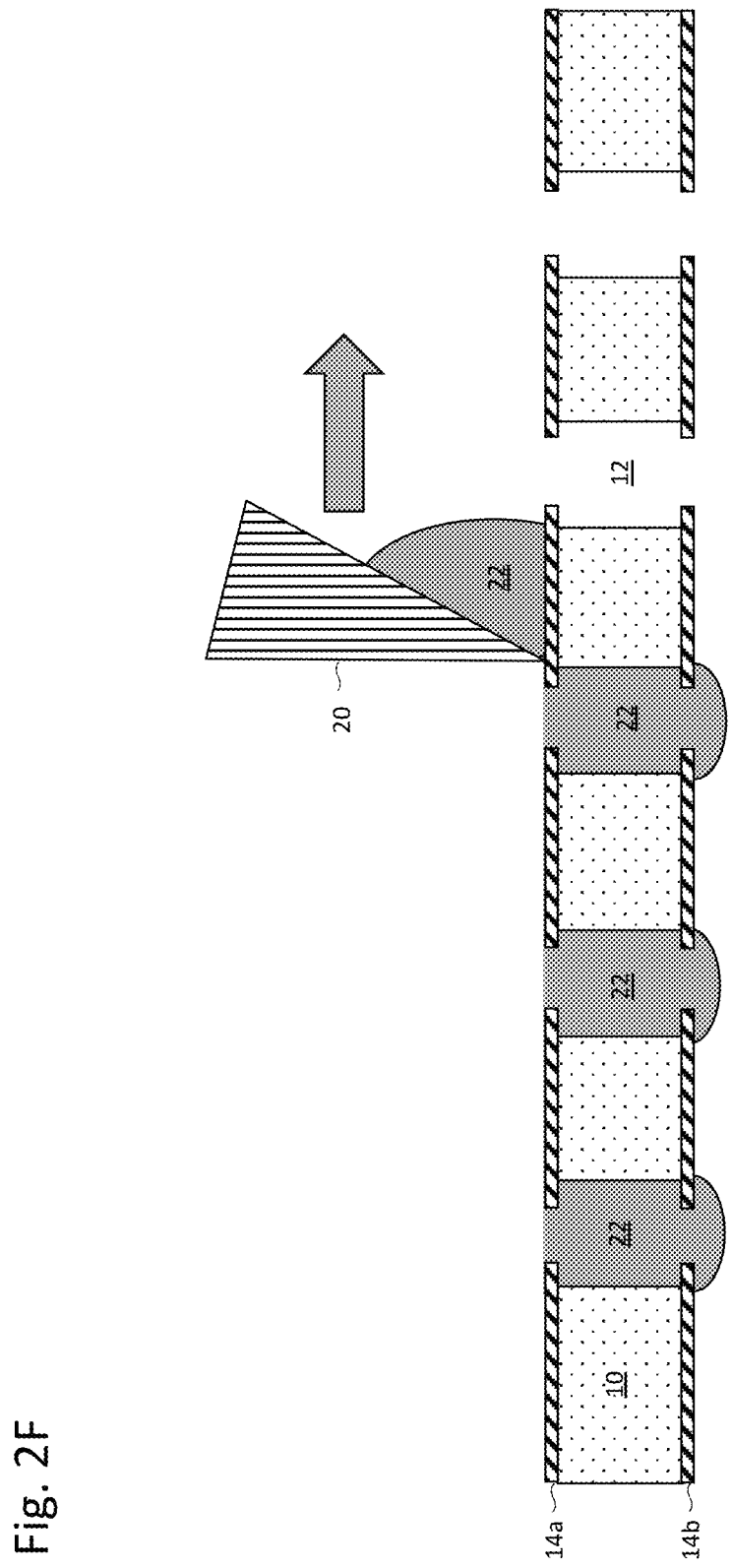
FIG. 2F depicts a squeegee or a knife being used to press metal paste into the through-holes of the substrate through the holes in the upper lamination foil, in accordance with one embodiment of the invention.

As shown in FIG. 2F, the force that is applied to the metal paste 22 may be strong enough to not only fill the through-holes 12 with the metal paste 22, but also to push some of the metal paste 22 out of the holes 18 in the lower lamination foil 14b. However, since the metal paste 22 is a viscous material, the metal paste 22 will not drip from the holes 18 in the lower lamination foil 14b, but rather will adhere to the area immediately adjacent to the holes 18 in the lower lamination foil 14b.

As shown in FIG. 2G, the squeegee or knife 20 may also be used to remove and collect the metal paste 22 that protrudes out of the holes 18 in the lower lamination foil 14b. During such step of removing the excess metal paste 22, a flexible backing member 24 may be secured to the upper lamination foil 14a in order to prevent the metal paste 22 from being pushed out of the holes 18 in the upper lamination foil 14a. Such excess metal paste 22 may be recycled (e.g., returned to a container from which the metal paste was dispensed and reused during the a subsequent filling process).

The upper and lower lamination foils 14a, 14b may then be removed, and heat may be applied to the substrate 10 in order to harden or cure the metal paste 12 within the through-holes 12 (not depicted). The resulting structure is shown in FIG. 3L, in which vias 30 (formed by the metal-filled through-holes 12) are present in the substrate 10. Once the lamination foils 14a, 14b have been removed, any metal paste 22 that adheres on the lamination foils 14a, 14b may be scraped off and also reused during a subsequent filling process.

FIGS. 3A-3L depict a related process to fill the through-holes 12 with metal paste 22. Like or similar components and/or steps will not be described in detail for the sake of conciseness.

Figure 3A:
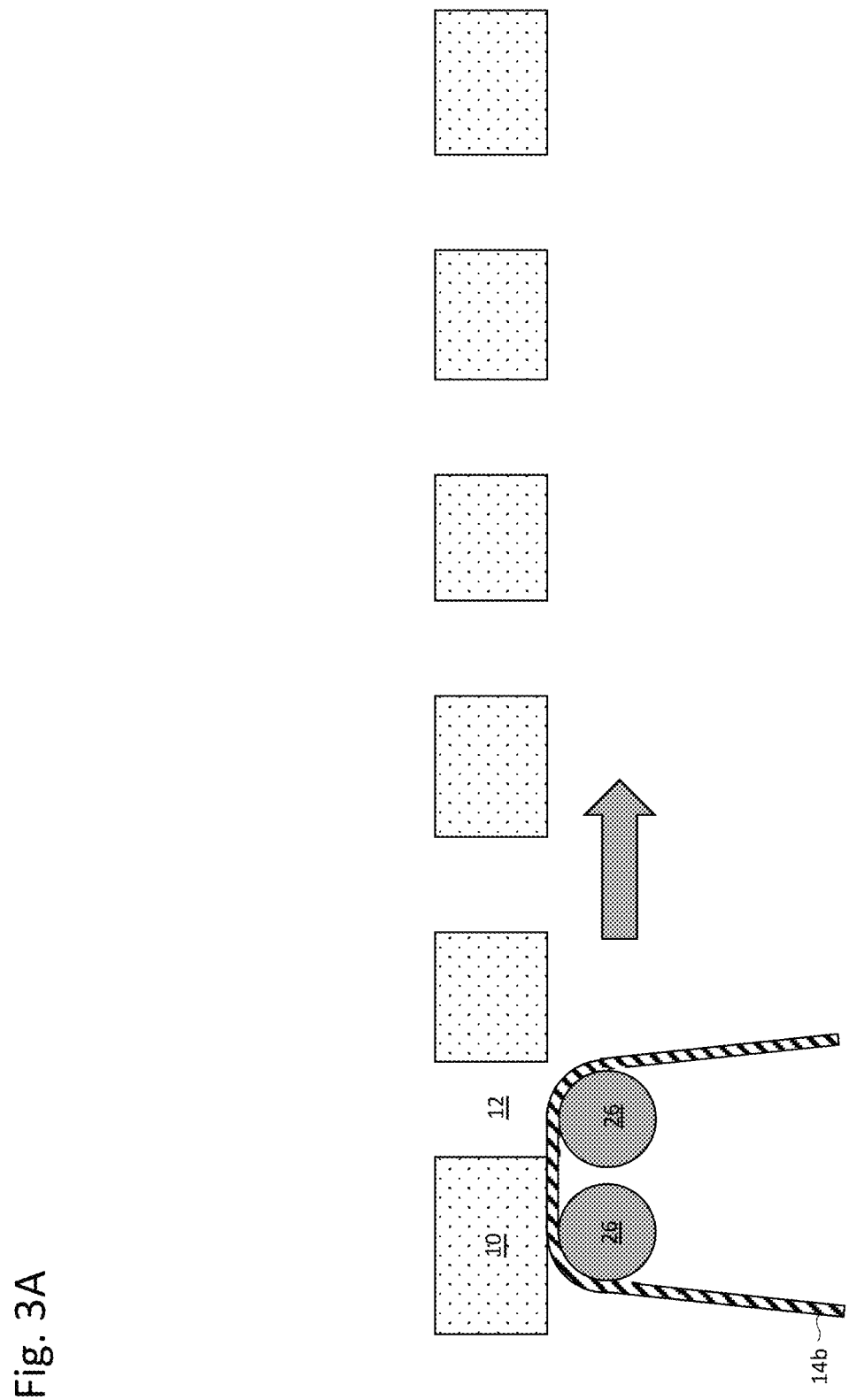
FIGS. 3A-3C depict rollers being used to secure a lamination foil onto the bottom surface of the substrate, in accordance with one embodiment of the invention.
Figure 3B:
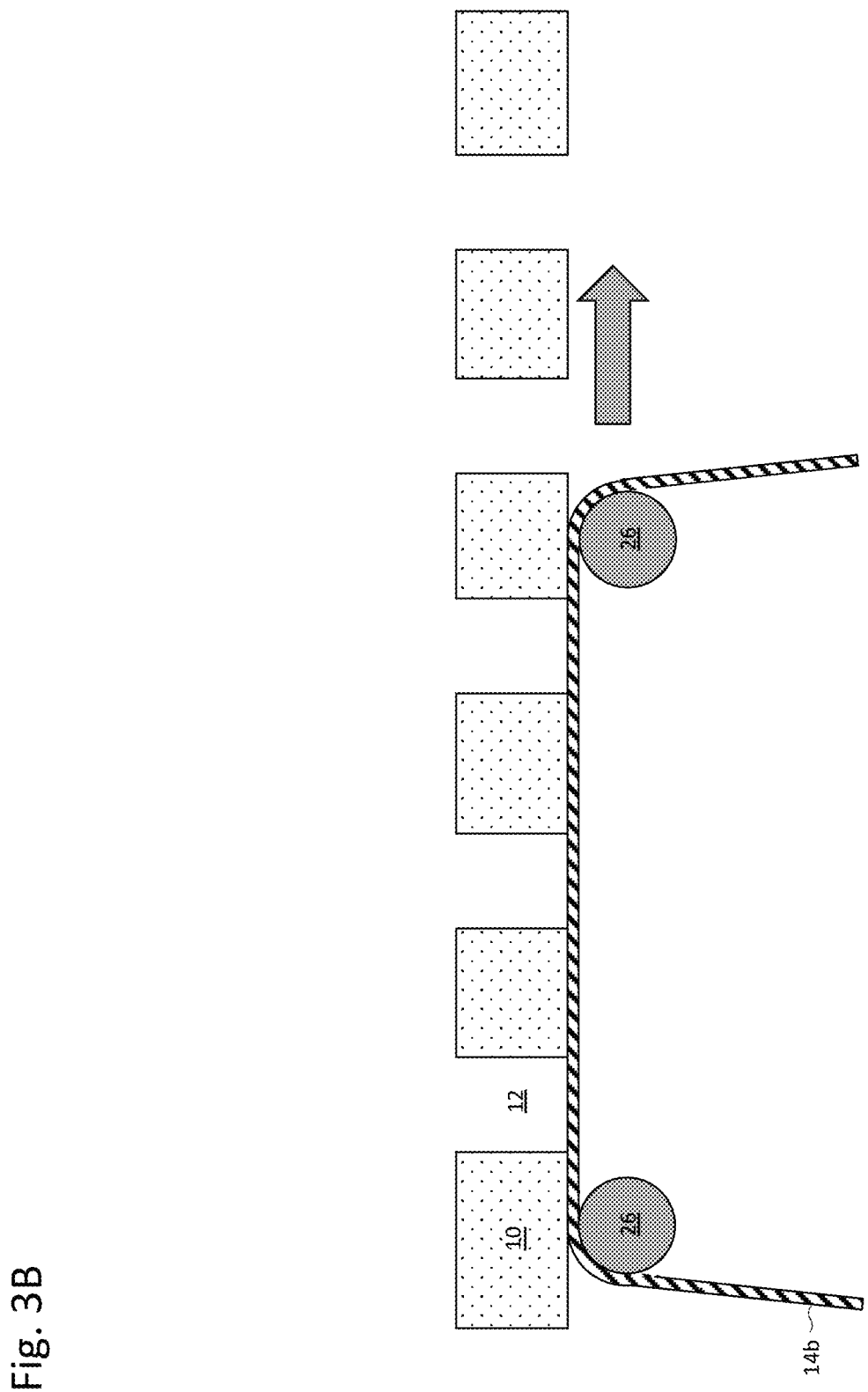
Figure 3C:
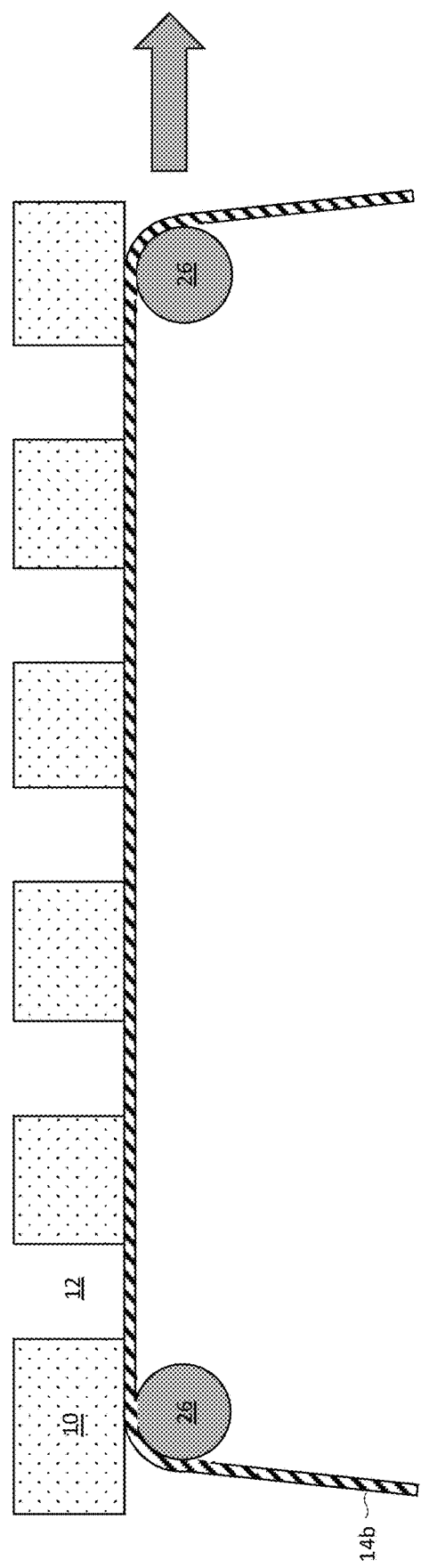

FIG. 3A depicts the lower lamination foil 14b being secured to the bottom surface of the substrate 10 using two rollers 26 that press the lamination foil 14b against the bottom surface of the substrate 10. As depicted in FIGS. 3B-3C, one of the rollers 26 may remain stationary while the other roller 26 is translated in a direction parallel to an extent of the substrate 10 so as to extend the lower lamination foil 14b over the bottom surface of the substrate 10.

Figure 3D:
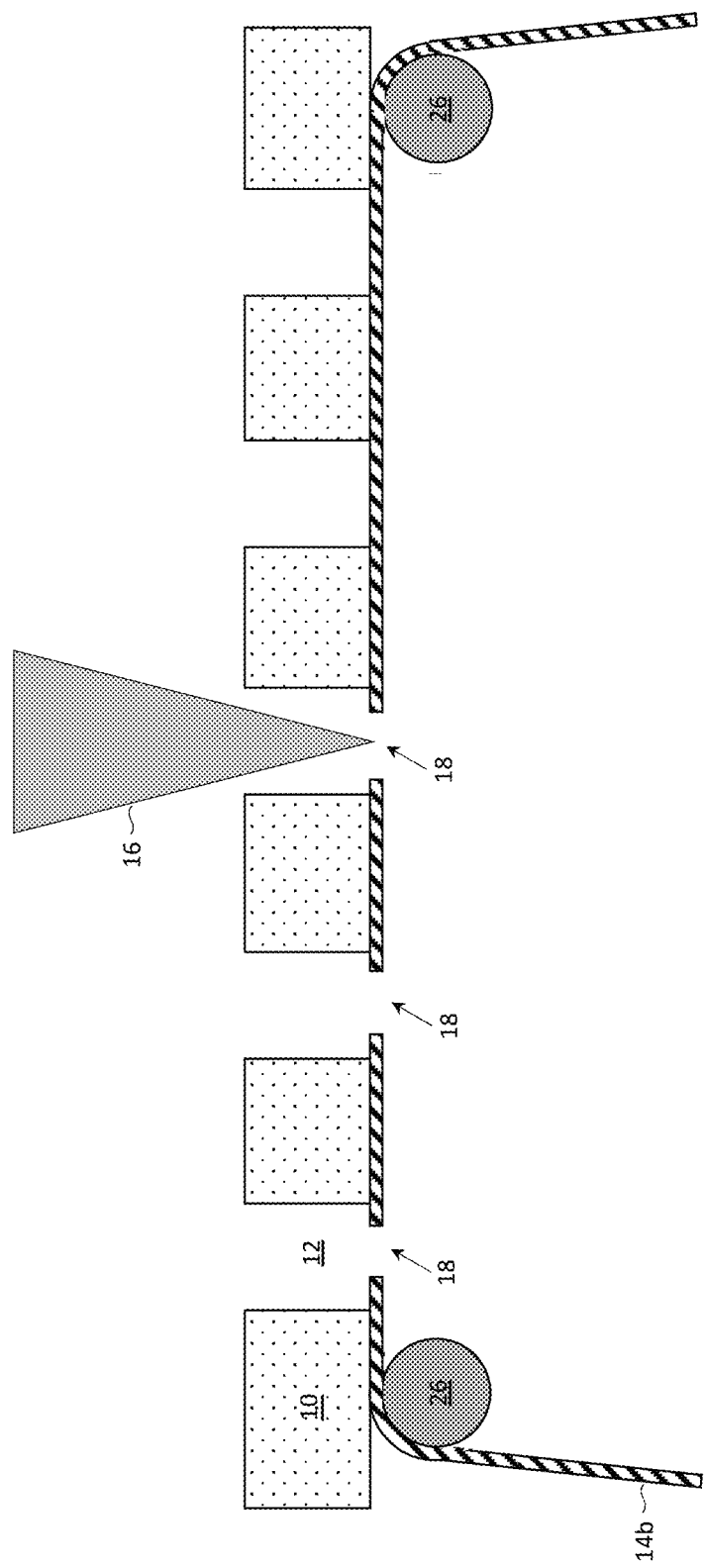
FIG. 3D depicts a laser beam being used to generate holes in the lower lamination foil, in accordance with one embodiment of the invention.

In contrast to the above-described process in FIGS. 2A-2G, immediately after the lower lamination foil 14b is secured to the substrate 10 (and before the upper lamination foil 14a is secured to the substrate 10), the laser beam 16 may be used to create holes 18 in the lower lamination foil 14b. Such step is shown in FIG. 3D.

Figure 3F:
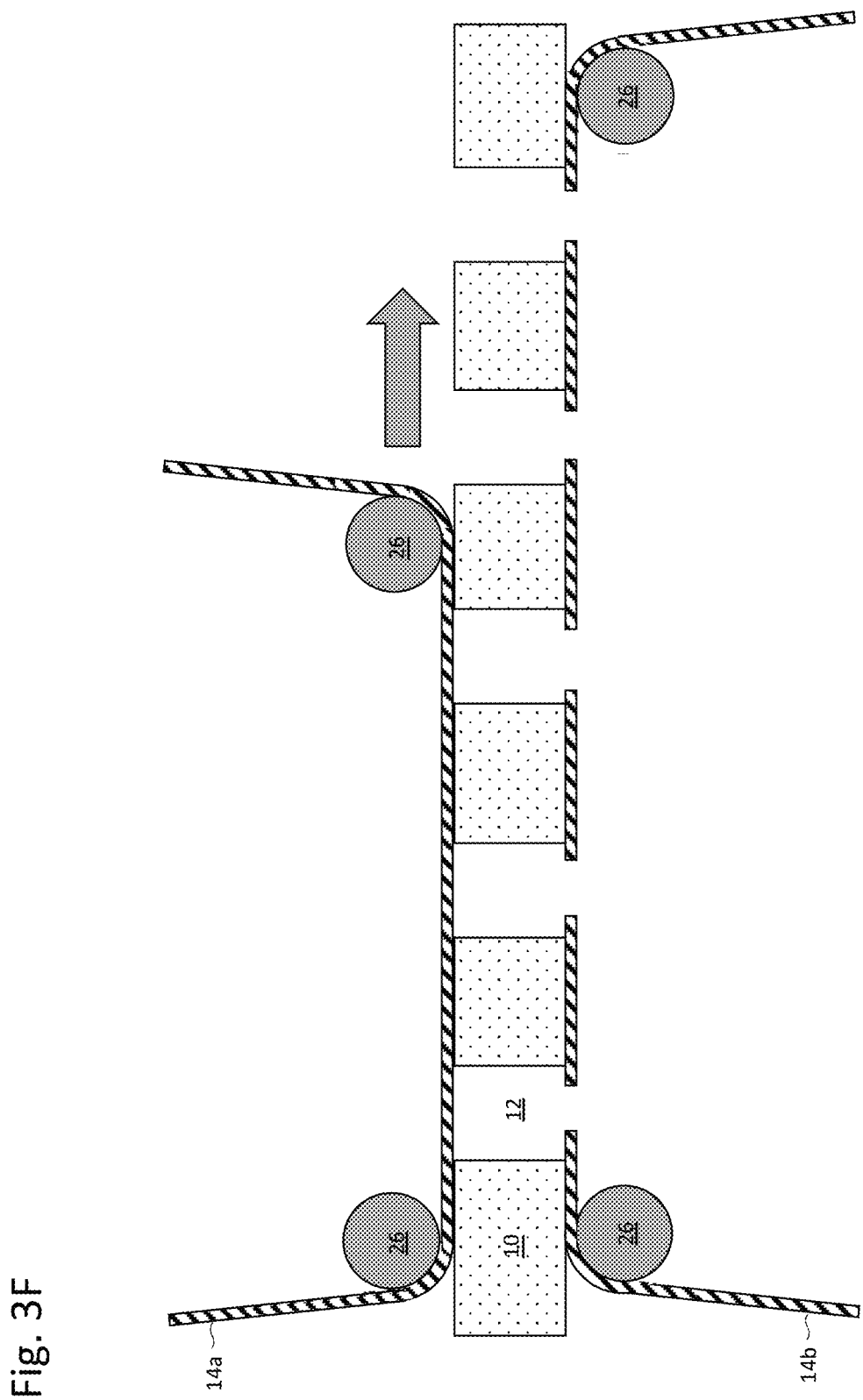
Figure 3G:
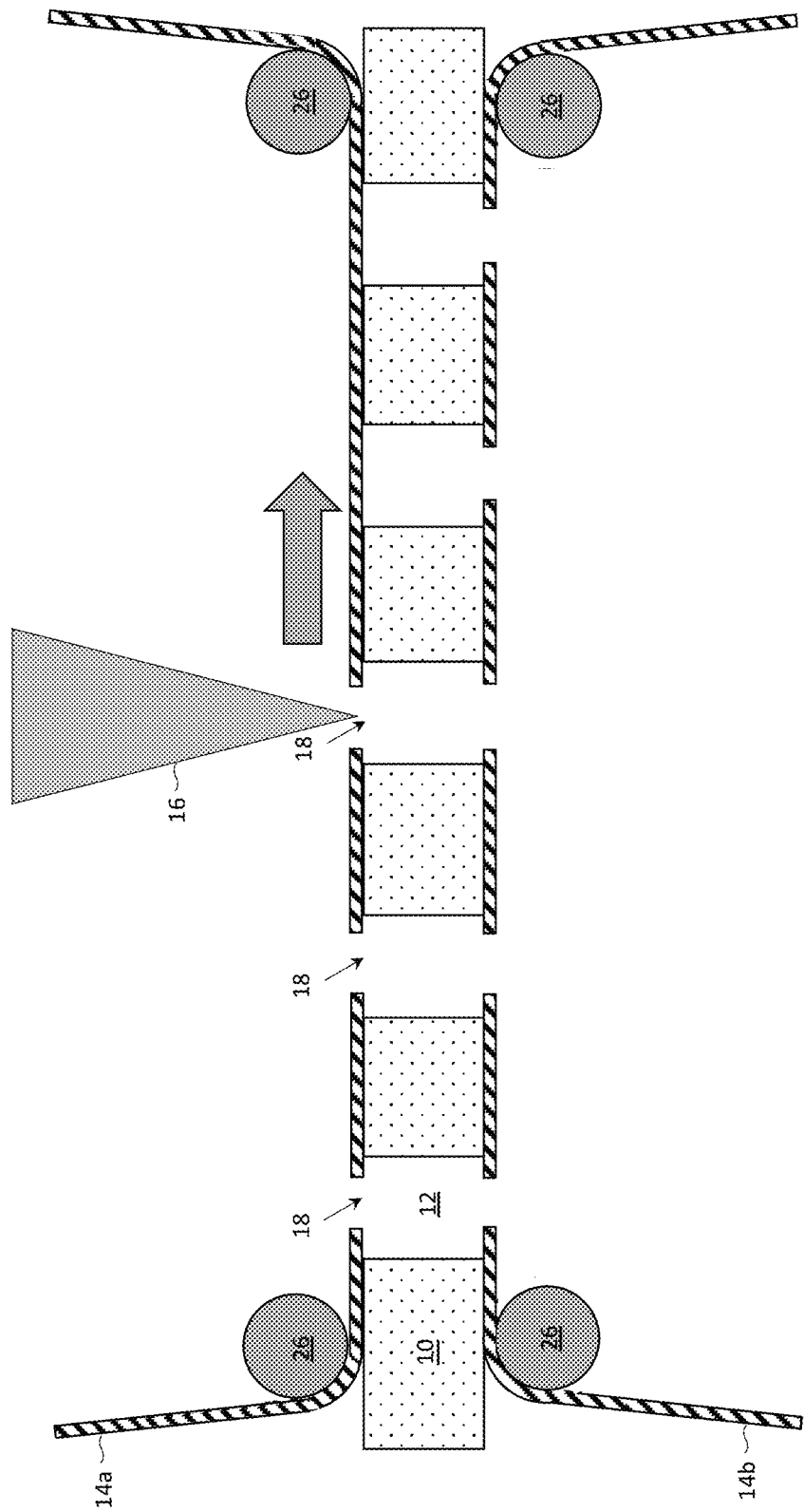
Figure 3L:
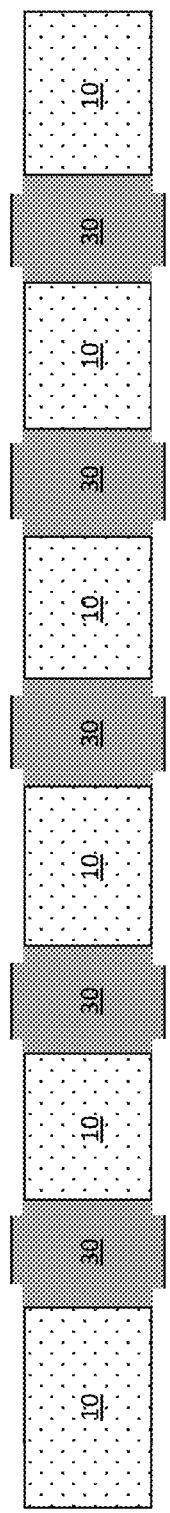
FIG. 3L depicts the substrate with the vias following the removal of the upper and lower lamination foils, in accordance with one embodiment of the invention.

FIG. 3E depicts the upper lamination foil 14a being secured to the top surface of the substrate 10 using two rollers 26 that press the lamination foil 14a against the top surface of the substrate 10. As depicted in FIGS. 3F-3G, one of the rollers 26 may remain stationary while the other roller 26 is translated in a direction parallel to an extent of the substrate 10 so as to extend the upper lamination foil 14a over the top surface of the substrate 10.

As also shown in FIG. 3G, the laser beam 16 may be used to create holes 18 in the upper lamination foil 14a.

FIG. 3H depicts end supports 28 being placed near the rollers 26 to better secure the lamination foils 14a, 14b to the substrate 10. A squeegee or knife 20 may be translated in a direction parallel to an extent of the substrate 10 in order to push metal paste 22 into the through-holes 12 through the holes 18 in the upper lamination foil 14a.

FIG. 3I depicts a squeegee or knife 20 being used to scrape off and collect the metal paste 22 that protrudes out of the holes 18 in the lower lamination foil 14b. A flexible backing member 24 may be placed between the end supports 28 so as to block any metal paste 22 from being pressed out of the holes 18 in the upper lamination foil 14a.

FIG. 3J depicts the structure after the excess metal paste has been removed by the squeegee or knife 20, and the flexible backing member 24 has been removed.

FIG. 3K depicts the structure after the end supports 28 have been removed. Two rollers 26 may be translated in a direction parallel to an extent to the substrate 10 so as to remove the top and lower lamination foils 14a, 14b from the substrate 10.

FIG. 3L depicts the structure resulting from the filling process—a substrate 10 with vias 30 (i.e., the through-holes 12 which have been filled with the metal paste 22). The structure has two basic properties: it has structural and/or mechanical properties that are dictated by the substrate 10, and it includes conductive paths through the substrate 10 that are formed by the vias 30.

While not depicted, both of the foils 14a, 14b may be linearly translated with rollers after the filling process, such that fresh segments of the lamination foil are used when carrying out the above-described filling process for every new substrate 10.

Figure 4:
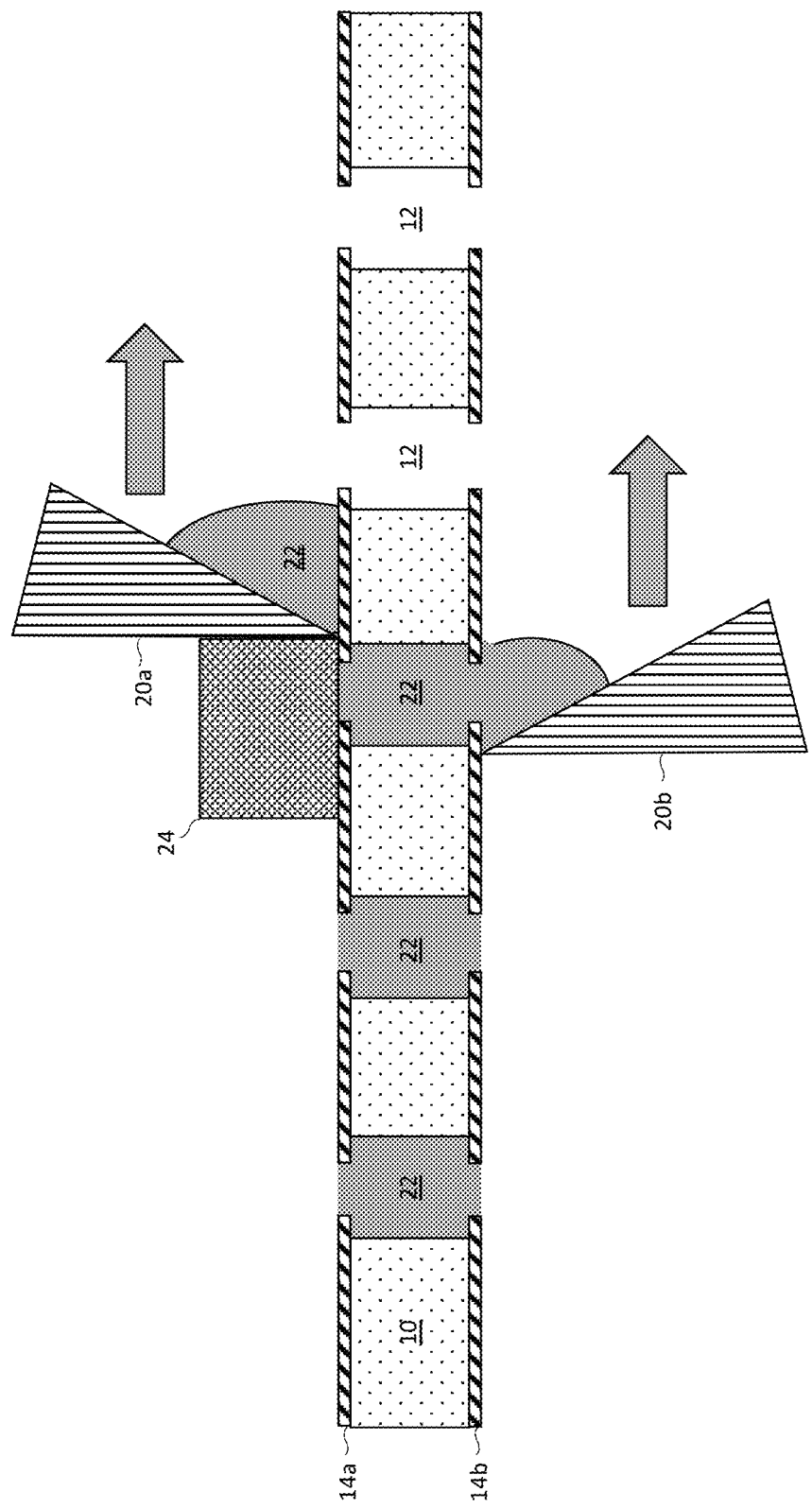
FIG. 4 depicts a variation of the filling operation, in accordance with one embodiment of the invention.

FIG. 4 depicts a variation of the filling process in which a leading squeegee (or knife) 20a is used to fill through-holes 12 with the metal paste 12 from a first end of the respective through-holes 12 and a trailing squeegee 20b (or knife) is used to scrape off excess metal paste 12 that protrudes out from the second end of the respective through-holes 12. The leading squeegee 20a may be coupled with a trailing backing member 24 that seals the first end of the through-hole 12 that has just been filled by the leading squeegee 20a so that the scraping of the excess metal paste 12 by the trailing squeegee 20b does not push the metal paste 12 back out of the first end of the through-hole 12.

Figure 5:
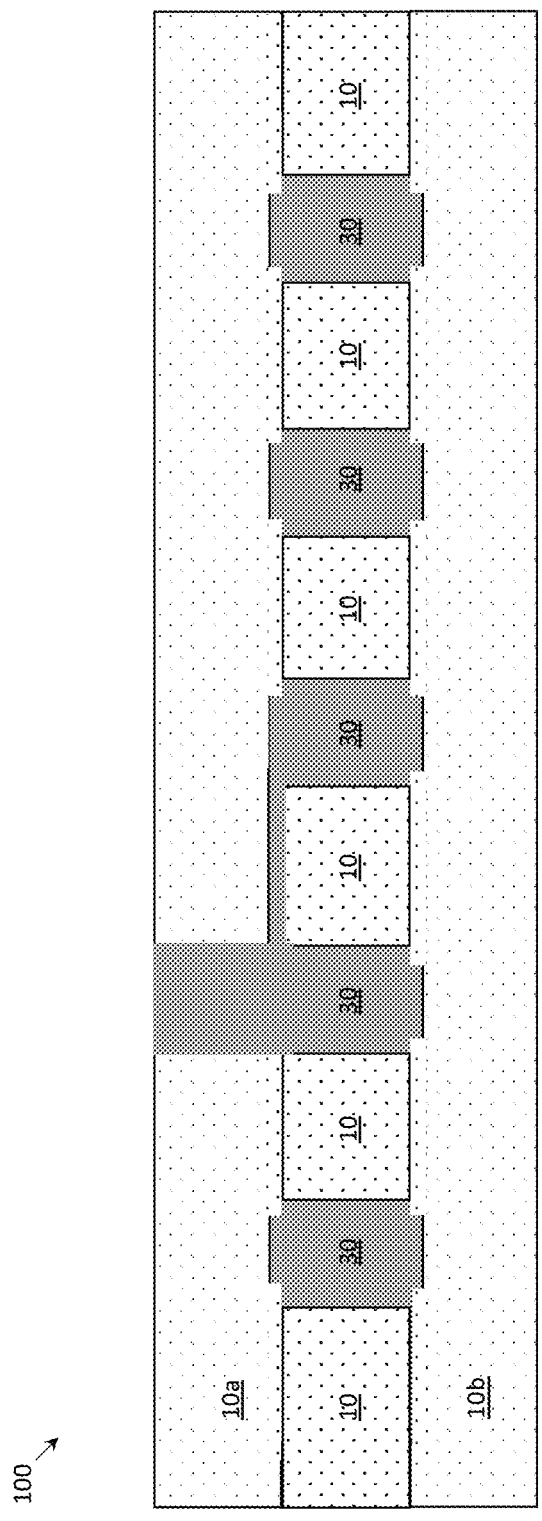
FIG. 5 depicts a PCB assembly that includes the substrate with the vias, in accordance with one embodiment of the invention.

FIG. 5 depicts a PCB assembly 100. As shown, the substrate 10 with the vias 30 may be disposed between other layers 10a, 10b of the PCB assembly 100.

Thus, methods for filling through-holes of a substrate with metal paste have been described. Many other embodiments will be apparent to those of skill in the art upon reviewing the above description. The scope of the invention should, therefore, be determined with reference to the appended claims, along with the full scope of equivalents to which such claims are entitled.

LIST OF REFERENCE NUMERALS

10 Substrate
10a,b Other layers of PCB assembly
12 Through-hole
14a Upper lamination foil
14b Lower lamination foil
16 Laser beam 18 Holes
20 Squeegee, knife
20a Leading squeegee, knife
20b Trailing squeegee, knife
22 Metal paste
24 Flexible backing member
26 Rollers
28 End supports
30 Vias
100 PCB assembly

What is claimed is:

1. A method for filling through-holes of a substrate with a metal paste, the method comprising:
   securing a first lamination foil onto a first surface of the substrate;
   securing a second lamination foil onto a second surface of the substrate;
   generating with a laser beam a first plurality of holes in the first lamination foil, respective locations of the first plurality of holes being aligned with the through-holes of the substrate;
   generating with the laser beam a second plurality of holes in the second lamination foil, respective locations of the second plurality of holes being aligned with the through-holes of the substrate;
   applying metal paste into the through-holes through the first plurality of holes in the first lamination foil, wherein applying metal paste into the through-holes through the first plurality of holes comprises using a squeegee or a knife to push the metal paste into the through-holes;
   sealing the first plurality of holes with a backing member;
   using the squeegee or knife to scrape off the metal paste that protrudes out of the second plurality of holes, while the backing member seals the first plurality of holes; and
   removing the first and second lamination foils from the substrate.

2. The method of claim 1, wherein the substrate comprises a flexible material.

3. The method of claim 1, wherein the substrate comprises a rigid material.

4. The method of claim 1, wherein a thickness of the substrate is between 1 μm and 1 mm.

5. The method of claim 1, wherein a thickness of each of the first and second lamination foils is less than 1 μm.

6. The method of claim 1, wherein a thickness of each of the first and second lamination foils is less than 100 μm.

7. The method of claim 1, wherein generating the first plurality of holes in the first lamination foil comprises the first lamination foil absorbing at least a portion of the laser beam.

8. The method of claim 1, wherein the laser beam is generated by one or more of an infrared (IR) laser, a visible laser, or an ultra-violet (UV) laser.

9. The method of claim 1, wherein the laser beam is generated by one or more of a microsecond pulsed laser, a nanosecond pulsed laser, or a picosecond pulsed laser.

10. The method of claim 1, wherein the metal paste comprises one or more of a copper paste, a silver paste or a gold paste.

11. The method of claim 1, further comprising subsequent to removing the first and second lamination foils, recycling the metal paste that has adhered to the first and second lamination foils.

12. The method of claim 1, wherein the substrate is part of a printed circuit board (PCB) assembly.

13. A method for filling through-holes of a substrate with a metal paste, the method comprising:
   securing a first lamination foil onto a first surface of the substrate;
   generating with a laser beam a first plurality of holes in the first lamination foil, respective locations of the first plurality of holes being aligned with the through-holes of the substrate;
   after generating the first plurality of holes, securing a second lamination foil onto a second surface of the substrate;
   generating with the laser beam a second plurality of holes in the second lamination foil, respective locations of the second plurality of holes being aligned with the through-holes of the substrate;
   applying metal paste into the through-holes through the second plurality of holes in the second lamination foil; and
   removing the first and second lamination foils from the substrate.

* * * * *